United States Patent
Zach

(10) Patent No.: US 9,366,716 B2
(45) Date of Patent: Jun. 14, 2016

(54) SUB-HARMONIC ARC FAULT DETECTION SYSTEM AND METHOD

(71) Applicant: Pentair Thermal Management, LLC, Menlo Park, CA (US)

(72) Inventor: Juergen J. Zach, Menlo Park, CA (US)

(73) Assignee: Pentair Thermal Management LLC, Menlo Park, CA (US)

( * ) Notice: Subject to any disclaimer, the term of this patent is extended or adjusted under 35 U.S.C. 154(b) by 292 days.

(21) Appl. No.: 13/901,393

(22) Filed: May 23, 2013

(65) Prior Publication Data

US 2014/0347065 A1  Nov. 27, 2014

(51) Int. Cl.
*G01R 31/12* (2006.01)
*G01R 31/02* (2006.01)

(52) U.S. Cl.
CPC .............. *G01R 31/12* (2013.01); *G01R 31/025* (2013.01)

(58) Field of Classification Search
CPC .. G01R 31/12; G01R 31/025; G01R 31/2805; G01R 31/024; G01R 31/2812; G01R 31/2884; G01R 31/2853; G01R 31/08
USPC .............................. 324/522, 536, 537; 361/42
See application file for complete search history.

(56) References Cited

U.S. PATENT DOCUMENTS

| | | | |
|---|---|---|---|
| 4,639,817 A | 1/1987 | Cooper et al. | |
| 5,206,596 A | 4/1993 | Beihoff et al. | |
| 5,272,439 A | 12/1993 | Mashikian et al. | |
| 5,307,230 A | 4/1994 | MacKenzie | |
| 5,373,241 A | 12/1994 | Ham, Jr. et al. | |
| 5,434,509 A | 7/1995 | Blades | |
| 5,452,223 A | 9/1995 | Zuercher et al. | |
| 5,477,150 A | 12/1995 | Ham, Jr. et al. | |
| 5,682,101 A | 10/1997 | Brooks et al. | |
| 5,729,145 A | 3/1998 | Blades | |
| 5,905,619 A | 5/1999 | Jha | |
| 5,986,860 A | 11/1999 | Scott | |
| 6,002,561 A | 12/1999 | Dougherty | |
| 6,031,699 A | 2/2000 | Dollar, II et al. | |
| 6,128,169 A | 10/2000 | Neiger et al. | |
| 6,195,214 B1 | 2/2001 | Muray et al. | |
| 6,259,996 B1 | 7/2001 | Haun et al. | |
| 6,362,628 B2 | 3/2002 | MacBeth et al. | |
| 6,373,257 B1 | 4/2002 | MacBeth et al. | |
| 6,400,258 B1 | 6/2002 | Parker | |
| 6,407,893 B1 | 6/2002 | Neiger et al. | |
| 6,459,273 B1 | 10/2002 | Dollar, II et al. | |
| 6,532,140 B1 | 3/2003 | McMahon et al. | |

(Continued)

*Primary Examiner* — Melissa Koval
*Assistant Examiner* — Felicia Farrow
(74) *Attorney, Agent, or Firm* — Quarles & Brady LLP

(57) ABSTRACT

Embodiments of the invention provide systems and methods for detecting a sustained arc in an electrical system. Over a time period, current and voltage data for a load signal are collected, from which spectral information is extracted. The spectral information has a frequency component and an amplitude component. The load signal is processed to remove a line frequency signature from the spectral information. One or more sub-harmonic frequency bands are extracted from the load signal and analyzed to determine the presence of an arc signature therein. The sub-harmonic frequency bands may be centered on frequencies corresponding to an integer number of half line cycle periods. Analysis of the sub-harmonic frequency bands can include detecting the peak amplitudes of the rectified sub-harmonic frequency bands to obtain an indicator signal and determining if the indicator signal exceeds a threshold that indicates the presence of the sustained arc.

19 Claims, 6 Drawing Sheets

(56) References Cited

U.S. PATENT DOCUMENTS

| | | |
|---|---|---|
| 6,567,250 B1 | 5/2003 | Haun et al. |
| 6,625,550 B1 | 9/2003 | Scott et al. |
| 6,751,528 B1 | 6/2004 | Dougherty |
| 6,859,042 B2 | 2/2005 | Parker |
| 7,035,066 B2 | 4/2006 | McMahon et al. |
| 7,038,897 B2 | 5/2006 | Csanky et al. |
| 7,062,388 B2 | 6/2006 | Rivers et al. |
| 7,068,480 B2 | 6/2006 | Wong et al. |
| 7,136,265 B2 | 11/2006 | Wong et al. |
| 7,190,561 B2 | 3/2007 | Pellon et al. |
| 7,190,562 B2 | 3/2007 | Pellon et al. |
| 7,227,729 B2 | 6/2007 | Parker et al. |
| 7,268,989 B2 | 9/2007 | Parker et al. |
| 7,307,820 B2 | 12/2007 | Henson et al. |
| 7,319,754 B2 | 1/2008 | Petitjean |
| 7,359,168 B2 | 4/2008 | Elms et al. |
| 7,368,918 B2 | 5/2008 | Henson et al. |
| 7,391,218 B2 | 6/2008 | Kojori et al. |
| 7,400,481 B2 | 7/2008 | Pellon et al. |
| 7,441,173 B2 | 10/2008 | Restrepo et al. |
| 7,463,037 B2 | 12/2008 | Henson et al. |
| 7,489,138 B2 | 2/2009 | Yu et al. |
| 7,492,163 B2 | 2/2009 | Restrepo et al. |
| 7,518,839 B2 | 4/2009 | Chou et al. |
| 7,633,727 B2 | 12/2009 | Zhou et al. |
| 7,633,728 B2 | 12/2009 | Parker et al. |
| 7,633,729 B2 | 12/2009 | Oldenburg et al. |
| 7,796,366 B2 | 9/2010 | Kilroy et al. |
| 7,834,637 B2 | 11/2010 | Kojori et al. |
| 7,864,492 B2 | 1/2011 | Restrepo et al. |
| 7,898,781 B2 | 3/2011 | Kawate et al. |
| 8,054,591 B2 | 11/2011 | Changali et al. |
| 8,373,570 B2 | 2/2013 | Restrepo et al. |
| 2006/0018060 A1 | 1/2006 | Elms et al. |
| 2009/0168277 A1 | 7/2009 | Changali et al. |
| 2012/0098672 A1* | 4/2012 | Restrepo et al. ......... 340/815.45 |
| 2012/0275071 A1 | 11/2012 | Gutierrez et al. |
| 2014/0347066 A1* | 11/2014 | Zach ............................ 324/537 |

* cited by examiner

SUB-HARMONIC ARC FAULT DETECTION SYSTEM AND METHOD

BACKGROUND

Arcing in electrical systems is a well-known but unwanted phenomenon, typically resulting from either poor installation procedures for system components, or breakdown of conductors or insulators in the system, creating an arc pathway between two conductors or to ground. Arcs may damage electrical system components immediately or over time and may cause potentially detrimental circuit breaks. If an arc has sufficient current and voltage, it may become a sustained arc that is either substantially constant or recurs at regular or irregular intervals. A sustained arc is desirable for applications such as welding, but in other applications an unwanted sustained arc can melt, corrode, or otherwise damage system components, and can reduce the overall performance of the system. In some electrical systems, a sustained arc may be produced at very small current levels.

Electrical systems often employ circuit protection devices, including arc detectors that place the system in a "fault" condition, such as by tripping a circuit breaker or initiating an alarm when the detector detects an arc that exceeds a certain threshold or contacts a certain component. Conventional circuit breakers are designed to protect electrical circuits by detecting overloads and short circuits. The amount of current transferred in these situations is high, so these devices have a low sensitivity to current variations and thereby avoid false alarms that would break the circuit without need. In contrast, a residual-current device ("RCD") is configured to disconnect an electrical circuit when the device detects an excessive imbalance in system current that can be caused by arcing transfer of current to a conductor that normally does not carry system current. RCDs, including ground fault interrupters ("GFIs"), earth leakage circuit breakers "ELCBs", safety switches, and trip switches, are configured with a much lower sensitivity than a conventional circuit breaker and are able to detect arc-induced erratic circuit behavior that does not trip a breaker. At such a low sensitivity, the RCD must be further configured to differentiate between an arc-induced current variation and one caused by normal circuit operation, such as the actuation of a switch, the activation or deactivation of a motor, or the sudden removal of a load by unplugging or other means, in the electrical system. This adds cost and complexity to RCDs, and false positive circuit interruption remains a major drawback for existing RCDs. Yet a third type of device, an arc fault circuit interrupter ("AFCI"), may detect variations in the current in both frequency and time which are not characteristic of any regular electrical loads.

However, while they can be more sensitive than some RCDs and can also detect arcs between load and neutral terminals not involving ground, experimental tests have shown that AFCIs are still not sufficiently sensitive to detect a sustained arc in some electrical systems. For example, in long parallel electrical heating cables, the part of the system affected by the arc is small compared to the overall heater, leading to a small electrical signature from the sustained arc. In particular, attempts to deploy known commercial AFCIs to detect sustained bus-to-bus arc faults in self-regulating polymer-based heating cables have failed. A further advantage of using sub-harmonic frequencies over frequencies at or greater than the line frequency is the weaker attenuation over long and lossy transmission lines for lower frequencies.

Another disadvantage of existing AFCIs can be that they rely on detecting frequency anomalies at frequencies which can be in the kHz or MHz range, but at any rate which are greater than the line frequency. In case of attenuating transmission lines which either lead to or are part of the electrical system, existing AFCIs may not detect arcing signatures that are better observable at frequencies below the line frequency.

SUMMARY

Some embodiments of the invention provide a method of detecting a sustained arc in an electrical system. The method includes collecting, over a predetermined time period and employing appropriate sensors such as shunt or sensing resistors, induction coils or Hall effect sensors, electrical voltage and current data for a load signal. The sensors are sampled in time domain with a rate of 100 Hz or greater, and most typically of 1 kHz. These data are then analyzed for spectral content. The spectral information is comprised by a frequency component and an amplitude component. The method further includes removing a line frequency signature from the spectral information, the line frequency signature comprising the electrical system's line current frequency and all frequencies greater than the line current frequency. The method further includes extracting at least one sub-harmonic frequency band from the spectral information and analyzing the at least one sub-harmonic frequency band to determine the presence of an arc signature. The center frequencies of the sub-harmonic bands can be twice the line frequency divided by integers of three or greater, and correspond to arcing bursts lasting an integer number of half-cycles of the line frequency.

Some embodiments of the invention provide another method of detecting a sustained arc in an electrical system. The method includes collecting, over a predetermined time period and employing appropriate sensors such as shunt or sensing resistors, induction coils or Hall effect sensors, electrical voltage and current data for a load signal. The sensors are sampled in time domain with a rate of 100 Hz or greater, and most typically of 1 kHz. These data are then analyzed for spectral content. The spectral information is comprised by a frequency component and an amplitude component. The method further includes removing a line frequency signature from the spectral information, the line frequency signature comprising a measured line frequency and all frequencies above the measured line frequency. The method further includes applying to the spectral information a plurality of bandpass filters to obtain a plurality of sub-harmonic frequency bands and dividing the plurality of sub-harmonic frequency bands into a plurality of time segments. The method further includes detecting an amplitude peak within each sub-harmonic frequency band in the plurality of time segments, and determining from the amplitude peaks if the arc signature is present in the plurality of time segments.

Some embodiments of the invention provide yet another method of detecting a sustained arc in an electrical system. The method includes collecting, over a predetermined time period and employing appropriate sensors such as shunt or sensing resistors, induction coils or Hall effect sensors, electrical voltage and current data for a load signal. The sensors are sampled in time domain with a rate of 100 Hz or greater, and most typically of 1 kHz. These data are then analyzed for spectral content. The spectral information is comprised by a frequency component and an amplitude component. The method further includes extracting a measured line frequency from an input signal and removing the measured line frequency from the spectral information. The method further includes applying to the spectral information a plurality of bandpass filters to obtain a plurality of sub-harmonic frequency bands, dividing the plurality of sub-harmonic frequency bands into a plurality of time segments; and determining if an amplitude peak within each time segment exceeds a threshold that indicates whether the sustained arc is present.

Some embodiments of the invention provide a method of detecting a sustained arc in an electrical system, wherein sub-harmonic frequency bands are compared to short-term historical values of arcing signatures in that type of electrical system, the short term being on the order of several seconds to several minutes. Other embodiments of the invention provide a method of detecting a sustained arc in an electrical system, wherein sub-harmonic frequency bands are compared to long-term historical values of arcing signatures in that type of electrical system, the long term being on the order of several days to several months.

DETAILED DESCRIPTION

Figure 1:
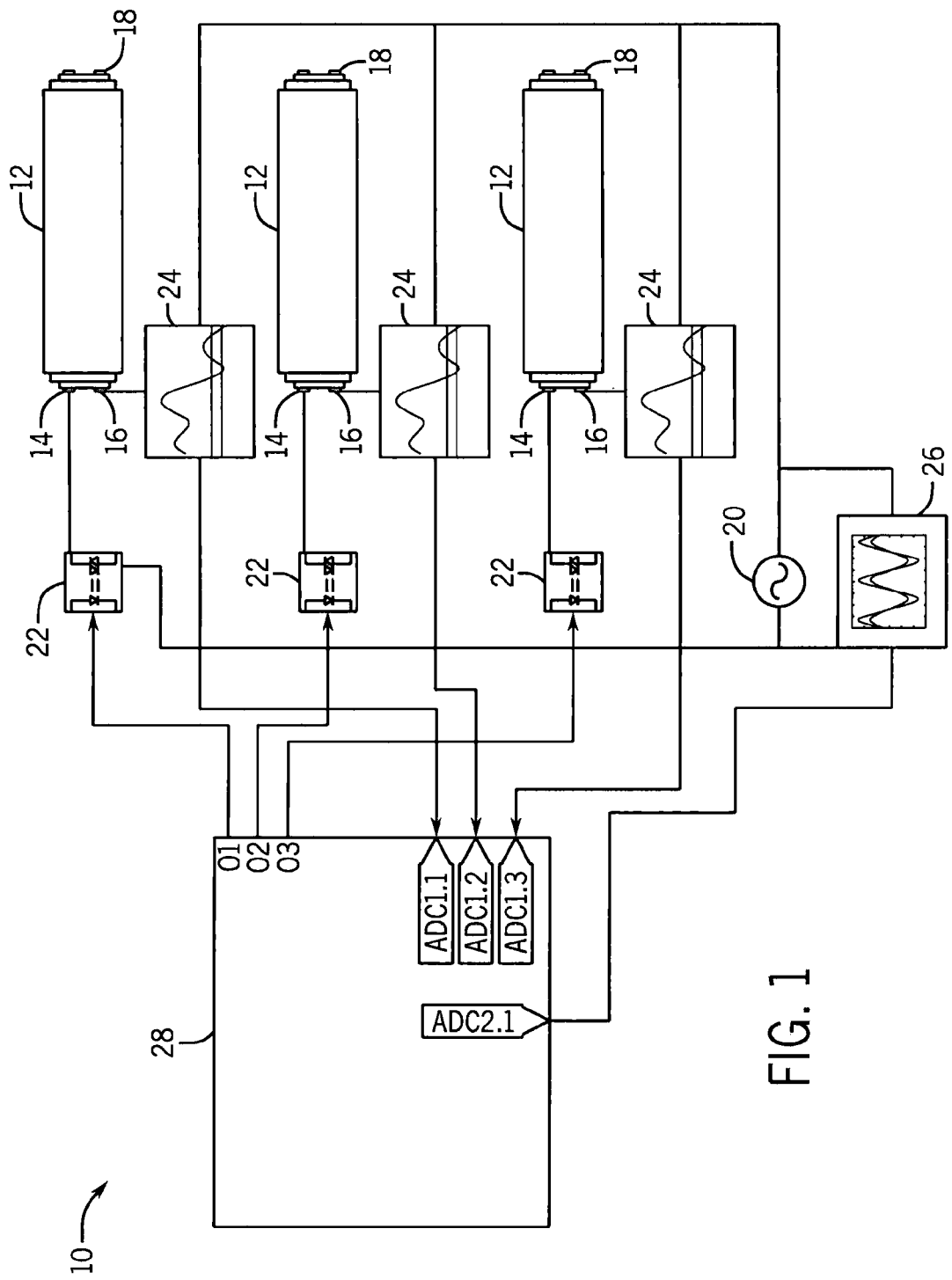
FIG. 1 is a schematic diagram of a system for detecting sustained arc faults in electrical systems according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

FIG. 1 illustrates a sustained arc monitoring system 10 according to one embodiment of the invention. The system 10 can include monitoring and reporting arrangements for one or more circuits of an electrical system 12. The arc monitoring system would be applicable to any electrical system, as long as the power is supplied by two conductors 14, 16. The conductors 14, 16 can be attached to opposite terminals of an alternating current power supply 20. The power supply 20 provides the electrical current, referred to herein as the line current, for all circuits. The line current may be produced at any suitable alternating current frequency, referred to, herein as the line frequency. Typically, the line frequency is 50 Hz or 60 Hz, as provided by mains power, but the line frequency may deviate significantly from its expected frequency due to characteristics of components in the electrical system. With reference to the figures, the line frequency is described herein at 60 Hz, but it will be understood that the described systems and methods can be used with any line frequency or deviated line frequency.

A circuit interrupter 22, such as a TRIAC, can be disposed between the first bus wire 14 and the power supply 20. A circuit monitor 24 can be disposed between the second conductor 16 and the power supply 20. The circuit monitor contains current probes such as shunt resistors, Hall effect probes, induction coils or transformers, as well as subsequent conditioning electronics. An input voltage monitor 26 can be disposed in electrical communication with the power supply 20. The voltage monitor can be comprised by a sensing resistor or any other voltage meter and subsequent conditioning electronics. A control unit 28 can be configured to receive input from one or more of the circuit monitors 24 and the input voltage monitor 26. The control unit 28 can be a microcontroller, a digital signal processor, or another control device or array of control devices having suitable capacity for the desired system 10 implementation. The control unit 28 can be configured to perform one or more of the sustained arc detection methods described herein, based on the input from the circuit monitors 24 and input voltage monitor 26. The control unit 28 can be in electrical communication with the circuit interrupters 22 in order to instruct a circuit interrupter 22 to interrupt the current if analysis of the corresponding circuit monitor's 24 input indicates that a sustained arc is present.

The system 10 can be configured to collect current and voltage measurements in the time-domain with an acquisition rate of at least 100 Hz, but typically at 1 kHz. Spectral information is extracted from the collected data regarding the frequency and amplitude of the line current supplied to the electrical system 12. The input voltage monitor 26 can collect line current data by being connected to the circuit across the power supply 20. This data stream is referred to herein as the "input signal" to the electrical system 12 and can contain one or more voltage measurements, as well as spectral information derived from the time domain measurements comprising frequency and amplitude components, for discrete time segments during which the data stream is collected. The input voltage monitor 26 can transmit the input signal to the control unit 28 for processing. The input signal can provide an independent measurement of the line frequency as well as its amplitude to be used in extracting information on arcing signatures from the load signal. The input signal can also provide a veto for anomalous input frequency, amplitude and phase fluctuations to cause false alarms in the load signal. Fluctuations which are strong enough to cause such a false trigger are rare and not anticipated during normal operation in environments where targeted electrical systems are deployed, but they are possible. Empirical measurements can be conducted which calibrate the thresholds of line frequency and amplitude fluctuations which would lead to a false positive, and these measurements can be used in the veto. The circuit monitor 24 can collect the time series data for the line current as it is affected by the electrical system 12. This data stream, along with the spectral information extracted from it is referred to herein as the "load signal" and can contain one or more current measurements, as well as spectral information comprising frequency and amplitude components, for discrete time segments during which the data stream is collected. The circuit monitor 24 can transmit the load signal to the control unit 28 for processing.

Figure 2:
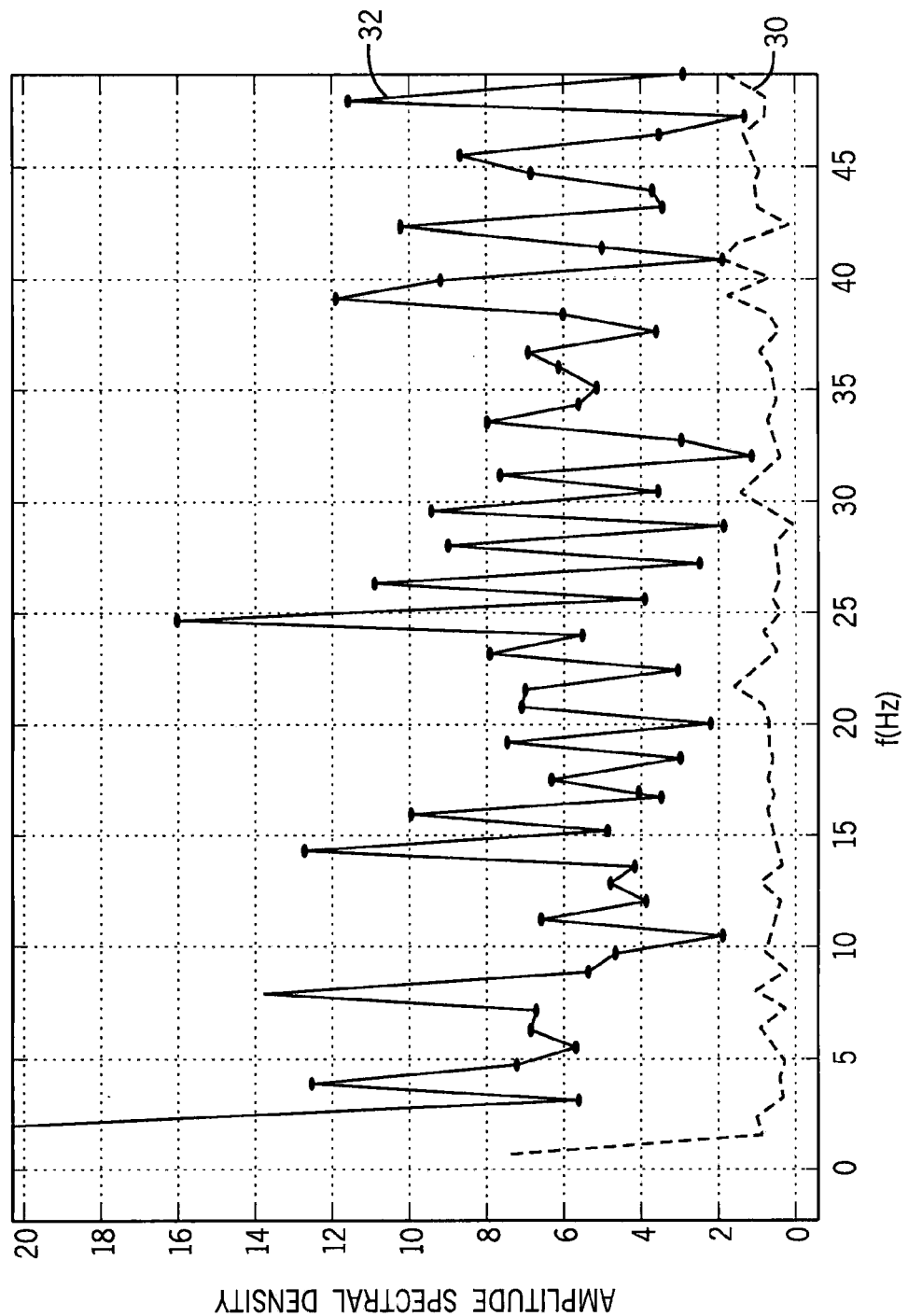
FIG. 2 is a diagram of a sub-harmonic current frequency spectrum comparison between an electrical system with no sustained arcs and an electrical system with sustained arcs.

FIG. 2 represents the amplitude spectra of the baseline load signal 30 versus an arcing load signal 32 containing sustained arcing. The illustrated example spectra 30, 32 are generated by a long parallel heating cable, which represents an example electrical system 12. The baseline load signal 30 for the electrical system 12 can be obtained directly from the electrical system 12, such as by collecting the data and deriving spectral information from the data as described herein in the field over the course of a baseline time scale, which may be as short as a few seconds in advance of an arcing event, or as long as one day, several days, or even weeks in order to determine the progressive development of arcing signatures. Alternatively, the baseline load signal 30 can be obtained through laboratory testing of the electrical system 12 itself, or a representative sample thereof, in advance of applying the detection methods herein to the electrical system 12 in the field. In contrasting the arcing load signal 32 to the baseline load signal 30, the arcing load signal 32 appears to have a generally higher amount of noise than the baseline load signal 30. Furthermore, most of the additional amplitudes in the arcing load signal 32 are centered on a number of discrete frequencies, which may correspond to arcing burst durations of an integer times one half of a line current period. Some or all of these additional sub-harmonic frequencies may contain a signature of sustained arcing, which may be detectable therein in accordance with this disclosure.

In some embodiments of the invention, the arc signal can be detected within one or more sub-harmonic frequency bands, and strong fluctuations in the line voltage can be monitored to eliminate false positives. Thus, monitoring of the line frequency and its harmonics can be limited to only the extent necessary to veto input voltage fluctuations. The line current can be monitored, before and after passing through the electrical system 12, with a sampling frequency that is at least twice the maximum frequency to be analyzed, considering that a sampling frequency greater than the highest frequency of interest by an order of magnitude improves the quality of sampling. A sampling rate of 1 kHz is an adequate conservative value. The time segments over which the collected spectral information is analyzed can be large enough to be statistically relevant, yet smaller than the thermal equilibrium timescales of the electrical system. For example, the time segments can be 0.5-2 seconds. In one embodiment, to warn against rapidly evolving arcs, the arcing signatures can be compared against a baseline reading over seconds or minutes prior to the present. In another embodiment, the baseline can be obtained from a longer-term deployment history, such as over weeks, months, or a year, of the electrical system 12, or from values determined in laboratory testing of a specific type of electrical system.

Figure 3:
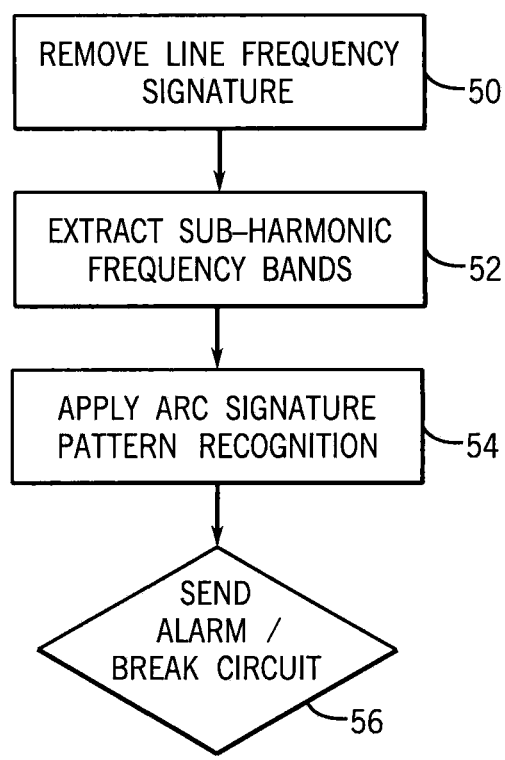
FIG. 3 is a flowchart showing a method of detecting sustained arcing in an electrical system using sub-harmonic frequency bands.

The detection methods described herein can be performed by a control unit or by any suitable computing unit or group of computing units. In some embodiments, some steps of the detection methods can be performed in the field, while others are performed in a laboratory or other data analysis location remote from the location of the electrical system 12. For example, the spectral information can be collected by a data logger placed in communication with the electrical system 12, and the data logger can transmit the collected data through a wired or wireless connection to high-performance personal computer or a mainframe. FIG. 3 illustrates one embodiment of a method for detecting sustained arcing by analyzing the spectral information of the load signal. At step 50, the control unit removes the line frequency signature from the spectral information of the load signal. The line frequency signature includes mainly the base line frequency. Removal of the line frequency signature allows for the use of computationally efficient bandpass filters to extract the sub-harmonic frequency bands in subsequent steps. In particular, at step 52, the microcontroller can use the efficient bandpass filters to extract the sub-harmonic frequency bands from the load signal. The number of frequency bands extracted is limited by practical considerations: whereas arcing bursts can last many times the line frequency period, the different frequencies for durations beyond $T_{burst}=10*T_0=10/(f_{Line})$ cannot be further resolved from one another. Hence, the number of frequency bands extracted is typically at most 10. Each frequency band can be extracted over a predetermined time period, and the extracted information can be further divided into time segments. At step 54, the microcontroller can apply arc signature pattern recognition processes to the time segments of the extracted frequency bands. Pattern recognition can include the extraction of the amplitude peaks versus time of the rectified signal within each frequency band. If the pattern recognition indicates the presence of an arc, at step 56, the microcontroller can send an alert, interrupt the circuit, or both.

Figure 4:
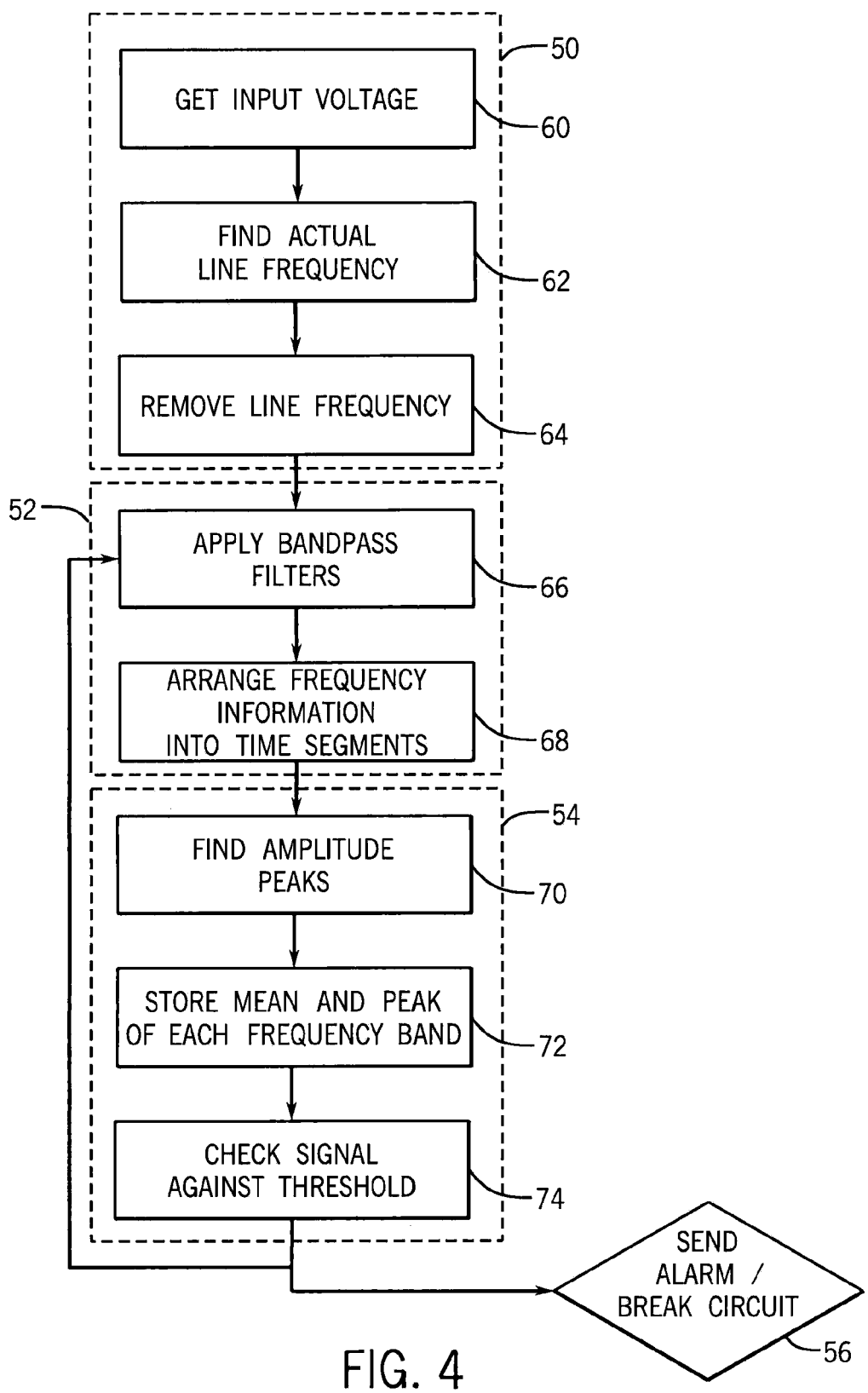
FIG. 4 is a flowchart showing another method of detecting sustained arcing in an electrical system using sub-harmonic frequency bands.

FIG. 4 illustrates an implementation of the method of FIG. 3. Removing the line frequency signature from the spectral information of the load signal can include, at step 60, obtaining an input signal. The input signal can be obtained from the power supply 20 or from the electrical system 12. The input signal includes frequency and amplitude components of the line current. The line frequency is either 50 Hz or 60 Hz depending on jurisdiction, but fluctuations in the current may continuously shift the line frequency by up to 5 Hz or more away from the theoretical frequency, particularly if the power supply is from a local source such as a generator. In order to accurately remove the line frequency signature, at step 62, the control unit can determine the actual, real-time line frequency. The microcontroller can perform adaptive notch filtering of the input signal to identify the period of the line current in the input signal. An adaptive notch filter implemented in one embodiment applies a filtering algorithm that matches the input signal function V(t) to the harmonic functions y(t), φ(t):

$$\phi(t)=\omega(t)t+\delta(t)$$

$$y(t)=A(t)\sin(\phi(t))$$

by minimizing the differential e(t) between the input signal function V(t) and the function y(t), whereas the result e(t) is the part of the signal which might contain arcing signatures:

$$e(t)=|V(t)-y(t)|$$

The control unit can recalculate and minimize e(t) continuously or at regular intervals in order to track the line frequency ω, amplitude A and phase φ. At step 64, the control unit can remove the line frequency signature from the load signal. This can include removing the line current frequency and all frequencies above the line current frequency from the load signal using a low-pass filter or other suitable filters.

Figure 5:
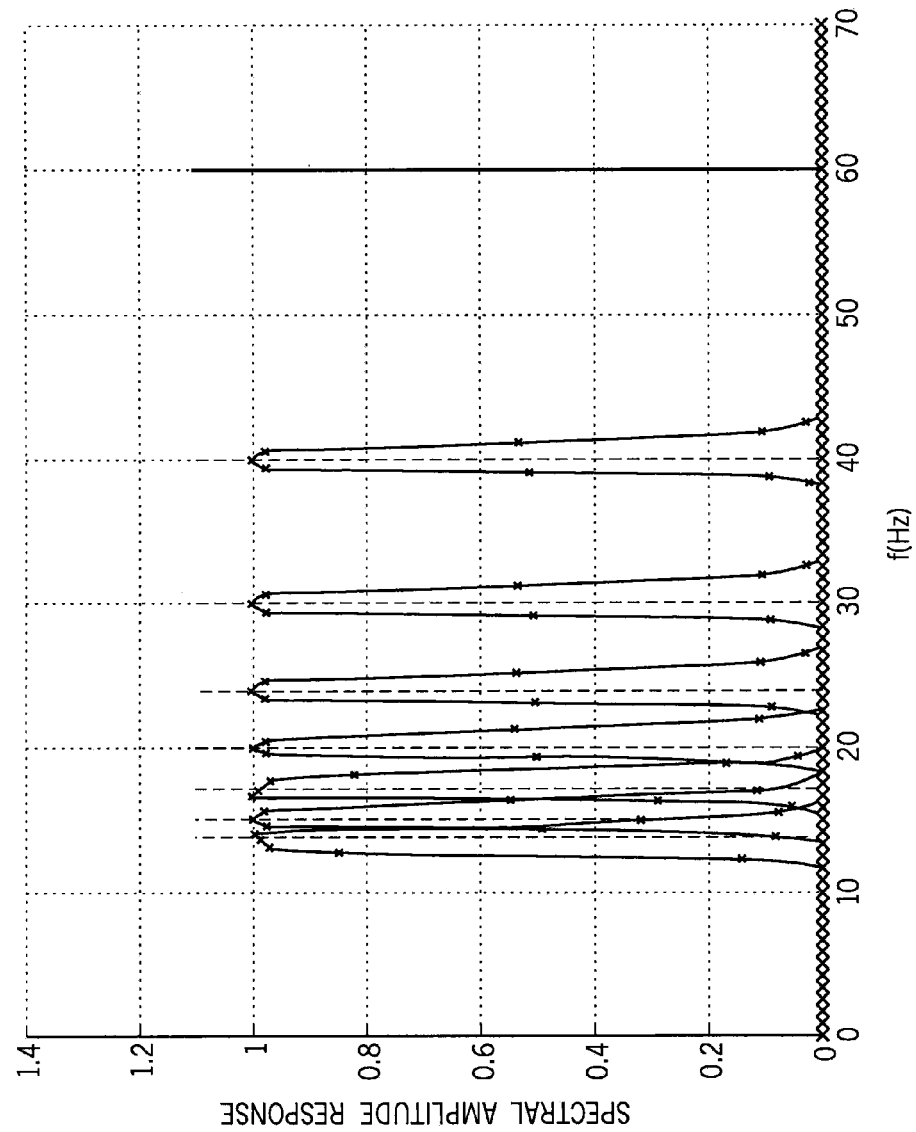
FIG. 5 is a diagram of the frequency response of a set of band-pass filters that extract sub-harmonic frequency bands in an electrical system.

Extracting the sub-harmonic frequency bands can include, at step 66, applying one or more bandpass filters to obtain the desired frequency bands centered on the frequencies f corresponding to an integer number of half line cycles periods according to the equation $f=2/Nf_0$, where $N \geq 3$, and $f_0$ is the line frequency. At a typical line frequency of 60 Hz, the desired frequency bands may therefore be centered on 40 Hz, 30 Hz, 24 Hz, 20 Hz, 17.2 Hz, and so on. See FIG. 5. Due to the notched removal of the line frequency peak, suitable bandpass filters can include computationally efficient filters, such as real-time, recursive, elliptic-notch filters with a spectral bandwidth of about 1-3 Hz for each sub-harmonic frequency band. A suitable filter profile can provide about 40 dB or better of rejection or better. FIG. 5 shows the amplitude response around the frequencies 40 Hz, 30 Hz, 24 Hz, 20 Hz, 17.2 Hz, 15 Hz, and 13.3 Hz when an array of bandpass filters is used to extract seven sub-harmonic frequency bands.

Figure 6:
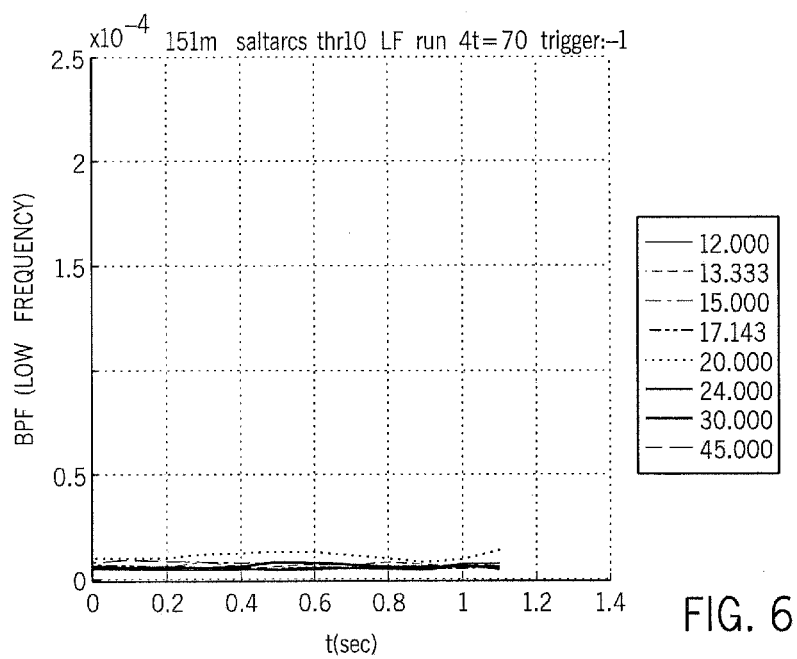
FIG. 6 is a diagram of peak amplitude of a rectified input signal, within eight sub-harmonic frequency bands, when no sustained arcing is present.
Figure 7:
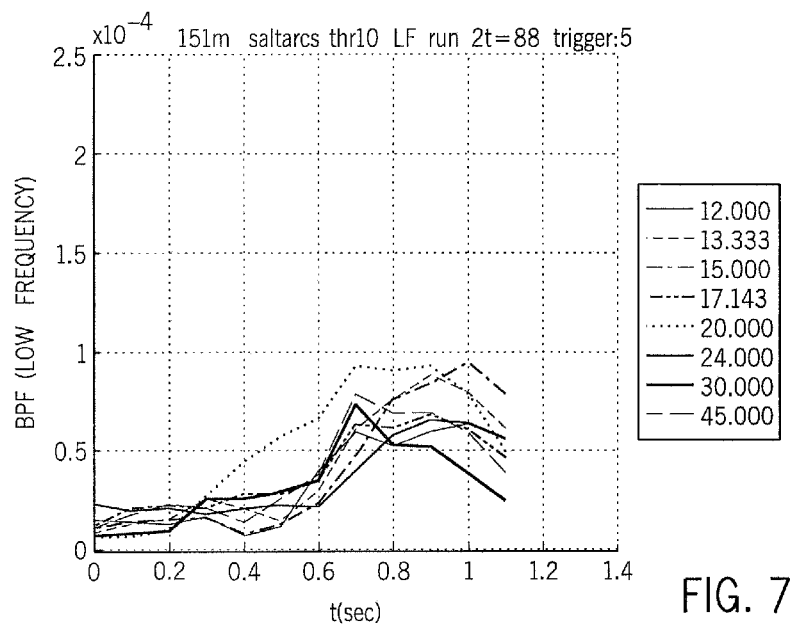
FIG. 7 is a diagram of peak amplitude of a rectified input signal, within eight sub-harmonic frequency bands, when sustained arcing is present.

Referring again to FIG. 4, at step 68, the filtered load signal can be divided into time segments. The time segments are large compared to one line cycle, but small compared to typical time scales in which an arc could trigger a fault condition. Suitable time segments have been determined to be in the range from about 0.5-3 seconds, and more particularly about 1-2 seconds. In order to avoid time boundary effects and possibly lose information, two data streams can be concurrently analyzed with time segment boundaries shifted by at most one half of a time segment. For example, FIG. 5 illustrates the peak amplitude versus time of seven rectified sub-harmonic frequency bands within a 1-second time segment. As shown in FIG. 6, in the absence of arcing signatures, the frequency bands remain at a substantially similar and relatively stable amplitude. In contrast, FIG. 7 illustrates the same sub-harmonic frequency bands processed in the same way as the frequency bands shown in FIG. 6, recorded from the load signal during sustained arcing for 1 second. The amplitudes of all sub-harmonic frequency bands vary drastically from the baseline, particularly during the latter part of the time segment shown in FIG. 7. These peaks indicate a current variation caused by a sustained arc, which gives raise to arcing bursts with a duration of an integer number of line half cycles.

Returning to FIG. 4, in one embodiment, the microcontroller can send an alert, break the circuit, or both, if the peak amplitude of one or more sub-harmonic frequency bands of the filtered and rectified load signal exceeds a certain threshold. Hence, the peak amplitude of the rectified sub-harmonic frequency band of the load signal exceeding a certain predetermined threshold comprises one possible indicator signal. In another embodiment, the indicating signal for arcing can be the time integral of one or more sub-harmonic frequency band of the filtered and rectified load signal over a predetermined time window to exceed a certain threshold. Each threshold can be determined by laboratory testing of specific types of electrical systems. The peak detection in a number of rectified sub-harmonic frequency bands can be used to determine if a sustained arc is present. At step 72, the microcontroller can record the mean and maximum values of indicator signal for each frequency band in each time segment. The values can be used to derive a historical median mean and a historical median peak for the indicator signal across all frequency bands. The historical values can be derived using the baseline load signal that is collected from the electrical system 12 in the field, or using laboratory-obtained values for the particular type of electrical system 12. At step 74, the indicator signal can be compared to the derived historical median values. As an arcing signature, the amount of time within each time segment the indicator signal exceeds the median or the historic signal maxima can be used as a second indicator signal in one embodiment. In another embodiment, the integrated difference between the measured signal and the historical baseline over time periods where arcing has been determined is used as a second indicator signal. If the second indicator signal is greater than a predetermined threshold in a predetermined number of frequency bands, at step 56, the microcontroller can send an alert, break the circuit, or both.

The described sustained arc detection system can be configured to detect other arcing phenomenon in the monitored electrical system. In one embodiment, the system can detect a ground fault according to one or more of the described detection methods or a subset thereof. It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A method of detecting a sustained arc in an electrical system, the method comprising:
    collecting over a predetermined time period a load signal by sampling in the time domain and subsequently extracting spectral information comprising a frequency component and an amplitude component;
    determining a line current frequency of the electrical system, the line current frequency being a real-time frequency of a line current;
    removing a line frequency signature from the spectral information, the line frequency signature comprising the line current frequency of the electrical system and all frequencies above the line current frequency;
    subsequent to removing the line frequency signature, extracting at least one sub-harmonic frequency band from the spectral information, wherein each of the at least one sub-harmonic frequency band contains only frequencies that are less than the determined line current frequency; and
    analyzing the at least one sub-harmonic frequency band to determine whether an arc signal is present.

2. The method of claim 1 wherein removing the line frequency signature comprises:
    tracking an input signal that contains the line frequency signature;
    extracting the line current frequency from the input signal as the input signal is tracked; and
    using the line current frequency to remove the line frequency signature from the spectral information.

3. The method of claim 2 wherein extracting the line current frequency from the input signal comprises applying an adaptive notch filter to the input signal.

4. The method of claim 1 wherein extracting the at least one sub-harmonic frequency band comprises applying at least one bandpass filter to the spectral information, the at least one bandpass filter comprising a pass-band around a frequency corresponding to twice the line current frequency divided by an integer greater than or equal to three.

5. The method of claim 1 wherein extracting the at least one sub-harmonic frequency band comprises dividing the at least one sub-harmonic frequency band into at least one time segment.

6. The method of claim 5 wherein the at least one time segment is between 0.5 and 3 seconds.

7. The method of claim 1 wherein analyzing the at least one sub-harmonic frequency band to determine whether an arc signal is present comprises:
   detecting an amplitude peak in at least one sub-harmonic frequency band to obtain an indicator signal; and
   determining if the indicator signal exceeds a threshold that indicates whether the sustained arc is present.

8. The method of claim 7 wherein the amplitude peak exceeds a baseline amplitude by an amount and for a duration adapted from a known arc signature, the pattern being determined by laboratory testing of a type of electrical system.

9. The method of claim 7 wherein analyzing the at least one sub-harmonic frequency band to determine whether an arc signal is present further comprises deriving at least one historical value for the spectral information, and wherein determining if the indicator signal exceeds a threshold comprises determining how long the indicator signal exceeds the at least one historical value.

10. The method of claim 7 wherein analyzing the at least one sub-harmonic frequency band to determine whether an arc signal is present further comprises deriving at least one historical value for the spectral information, and wherein determining if the indicator signal exceeds a threshold comprises determining by how much the indicator signal exceeds the at least one historical value.

11. A method of detecting a sustained arc in an electrical system, the method comprising:
   collecting over a predetermined time period a load signal;
   extracting spectral information from the load signal, the spectral information comprising a frequency component and an amplitude component;
   removing a line frequency signature from the spectral information, the line frequency signature comprising a measured line frequency;
   removing from the spectral information all frequencies above the measured line frequency;
   applying to the spectral information a plurality of bandpass filters to obtain a plurality of sub-harmonic frequency bands, wherein the plurality of sub-harmonic frequency bands each have only lower frequencies than the measured line frequency;
   dividing the plurality of sub-harmonic frequency bands into a plurality of time segments;
   detecting an amplitude peak within each sub-harmonic frequency band in the plurality of time segments; and
   determining from the amplitude peaks if the arc signature is present in the plurality of time segments.

12. The method of claim 11 wherein the plurality of time segments are each between about 0.5 and 3 seconds long.

13. The method of claim 11 wherein determining the amplitude peak in each sub-harmonic frequency band produces an indicator signal, and wherein determining if the arc signature is present in the plurality of time segments comprises determining if the indicator exceeds at least one historical value of the amplitude component of the spectral information.

14. The method of claim 13 wherein determining if the arc signature is present in the plurality of time segments further comprises determining for how long the indicator exceeds the at least one historical value.

15. The method of claim 11 further comprising:
   tracking an input signal that contains the line frequency signature; and
   extracting the measured line frequency from the input signal.

16. The method of claim 15 wherein extracting the measured line frequency from the input signal comprises applying an adaptive notch filter to the input signal.

17. A method of detecting a sustained arc in an electrical system, the method comprising:
   collecting over a predetermined time period a load signal;
   extracting spectral information from the load signal, the spectral information comprising a frequency component and an amplitude component;
   extracting a measured line frequency from an input signal;
   removing the measured line frequency from the spectral information;
   applying to the spectral information a plurality of bandpass filters to obtain a plurality of sub-harmonic frequency bands, wherein the sub-harmonic frequency bands each have only lower frequencies than the measured line frequency;
   dividing the plurality of sub-harmonic frequency bands into a plurality of time segments; and
   determining if an amplitude peak within each time segment exceeds a threshold that indicates whether the sustained arc is present.

18. The method of claim 17 further comprising deriving at least one historical value for the spectral information, and wherein determining if the indicator signal exceeds a threshold comprises determining how long the indicator signal exceeds the at least one historical value.

19. The method of claim 17 wherein each of the bandpass filters comprises a pass-band around a frequency corresponding to twice the line current frequency divided by an integer greater than or equal to three.

* * * * *